(12) United States Patent
Yvon

(10) Patent No.: US 9,536,747 B2
(45) Date of Patent: Jan. 3, 2017

(54) METHOD FOR TREATING A GALLIUM NITRIDE LAYER COMPRISING DISLOCATIONS

(71) Applicant: STMICROELECTRONICS (TOURS) SAS, Tours (FR)

(72) Inventor: Arnaud Yvon, Sainy-Cyr sur Loire (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 0 days.

(21) Appl. No.: 14/464,158

(22) Filed: Aug. 20, 2014

(65) Prior Publication Data

US 2015/0064881 A1    Mar. 5, 2015

(30) Foreign Application Priority Data

Aug. 30, 2013    (FR) ...................... 13 58324

(51) Int. Cl.
| | |
|---|---|
| *H01L 21/306* | (2006.01) |
| *H01L 21/02* | (2006.01) |
| *H01L 21/322* | (2006.01) |
| *H01L 29/20* | (2006.01) |
| *H01L 29/66* | (2006.01) |

(52) U.S. Cl.
CPC ... *H01L 21/30625* (2013.01); *H01L 21/02002* (2013.01); *H01L 21/0254* (2013.01); *H01L 21/02381* (2013.01); *H01L 21/02458* (2013.01); *H01L 21/02494* (2013.01); *H01L 21/02664* (2013.01); *H01L 21/30612* (2013.01); *H01L 21/30621* (2013.01); *H01L 21/3228* (2013.01); *H01L 29/2003* (2013.01); *H01L 29/66212* (2013.01)

(58) Field of Classification Search
CPC .......... H01L 21/0254; H01L 21/30625; H01L 21/30612; H01L 21/30621; H01L 21/02002; H01L 29/66212; H01L 21/02381; H01L 21/02494; H01L 21/3228; H01L 21/02664; H01L 21/02458; H01L 29/2003
See application file for complete search history.

(56) References Cited

U.S. PATENT DOCUMENTS

| | | | |
|---|---|---|---|
| 8,212,259 B2 * | 7/2012 | Flynn et al. .................... 257/76 |
| 2001/0009167 A1 * | 7/2001 | Davis et al. .................... 148/33 |
| 2003/0162340 A1 * | 8/2003 | Tezen ............................ 438/184 |
| 2003/0209185 A1 * | 11/2003 | Ueno et al. ...................... 117/2 |
| 2007/0096239 A1 * | 5/2007 | Cao et al. ...................... 257/458 |
| 2007/0138505 A1 * | 6/2007 | Preble et al. ................. 257/190 |
| 2007/0259504 A1 * | 11/2007 | Bour et al. .................... 438/341 |
| 2008/0105903 A1 | 5/2008 | Kodama et al. |

(Continued)

OTHER PUBLICATIONS

Lee et al. "Doping level-dependent dry-etch damage in n-type GaN", Journal of Electroceramics, vol. 17, No. 2-4, Dec. 2006, pp. 227-230.

*Primary Examiner* — Latanya N Crawford

(74) *Attorney, Agent, or Firm* — Allen, Dyer, Doppelt, Milbrath & Gilchrist, P.A.

(57) ABSTRACT

A method is for treating a doped gallium nitride substrate of a first conductivity type, having dislocations emerging on the side of at least one of its surfaces. The method may include: a) forming, where each dislocation emerges, a recess extending into the substrate from the at least one surface; and b) filling the recesses with doped gallium nitride of the second conductivity type.

19 Claims, 1 Drawing Sheet

(56) References Cited

U.S. PATENT DOCUMENTS

| | | | |
|---|---|---|---|
| 2010/0044718 A1* | 2/2010 | Hanser | C30B 25/02 257/76 |
| 2010/0323506 A1* | 12/2010 | Cheng et al. | 438/507 |
| 2010/0327291 A1* | 12/2010 | Preble | C30B 25/02 257/76 |
| 2011/0101369 A1* | 5/2011 | Zhu | 257/76 |
| 2011/0121357 A1 | 5/2011 | Lester et al. | |
| 2011/0198590 A1* | 8/2011 | Preble | C30B 25/02 257/49 |
| 2013/0032814 A1* | 2/2013 | Bour | H01L 21/0254 257/76 |
| 2013/0056743 A1* | 3/2013 | Bour et al. | 257/76 |
| 2013/0153921 A1* | 6/2013 | Cho et al. | 257/76 |
| 2014/0048902 A1* | 2/2014 | Raj | H01L 29/872 257/472 |
| 2014/0057417 A1* | 2/2014 | Leirer et al. | 438/478 |
| 2014/0183594 A1* | 7/2014 | Loffler et al. | 257/103 |

\* cited by examiner

METHOD FOR TREATING A GALLIUM NITRIDE LAYER COMPRISING DISLOCATIONS

PRIORITY

This application claims the priority benefit of French Patent Application No. 13/58324, filed on Aug. 30, 2013, the contents of which is hereby incorporated by reference in its entirety to the maximum extent allowable by law.

FIELD OF THE INVENTION

The present disclosure relates to the forming of electronic components inside and on top of single-crystal gallium nitride substrates. It more specifically relates to a method for treating or preparing a doped single-crystal gallium nitride substrate for the forming of electronic components inside and on top of this substrate.

BACKGROUND

Electronic components, and especially power components such as Schottky diodes, have already been formed by using doped single-crystal gallium nitride as a semiconductor material.

Conventionally, gallium nitride substrates may be solid substrates, of a thickness ranging from a few tens to a few hundreds of micrometers, or appear in the form of a gallium nitride layer having a thickness of a few micrometers coating a support of another material, for example, a silicon support.

Whether they are solid (freestanding) or supported by a support material, gallium nitride substrates generally have dislocations, corresponding to discontinuities in the organization of their crystal structure. Such dislocations may raise issues in certain applications.

SUMMARY

Thus, an embodiment provides a method of treating a doped gallium nitride substrate of a first conductivity type, having dislocations emerging on the side of at least one of its surfaces, comprising: a) forming, where each dislocation emerges, a recess extending into the substrate from the at least one surface; and b) filling the recesses with doped gallium nitride of the second conductivity type.

According to an embodiment, step b) comprises a step of epitaxial deposition, on the at least one surface, of a doped single-crystal gallium nitride layer of the second conductivity type, followed by a step of planarization of this layer.

According to an embodiment, during the planarization step, the gallium nitride layer is removed everywhere except from the recesses.

According to an embodiment, the planarization step comprises a chem.-mech. polishing.

According to an embodiment, at step a), the recesses are formed by means of a wet etching solution applied on the at least one surface.

According to an embodiment, the etching solution comprises potassium hydroxide at a concentration in the range 10 to 90%.

According to an embodiment, the etching solution comprises phosphoric hydroxide at a concentration in the range 10 to 90%.

According to an embodiment, at step a), the recesses are formed by means of a chlorine plasma.

According to an embodiment, at step a), the forming of the recesses comprises a step of annealing the substrate at a temperature greater than or equal to 830° C.

According to an embodiment, the first and second conductivity types respectively are type N and type P.

Another embodiment provides a method for manufacturing a gallium nitride semiconductor component, comprising: treating, according to the above-mentioned method, a doped gallium nitride substrate of a first conductivity type, having dislocations emerging on the side of at least one of its surfaces; and depositing at least one conductive, semiconductor, or insulating layer on the at least one surface.

According to an embodiment, the component is a Schottky diode, and the conductive, semiconductor, or insulating layer is a metal layer.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

In the rest of the present description, unless otherwise indicated, terms "on the order of", "approximately", "substantially" and "around" mean to within ten percent.

Figure 1A:
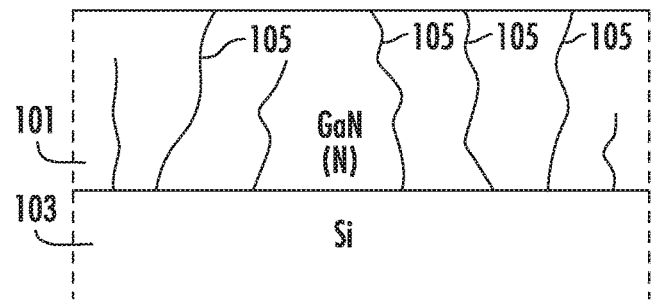
FIGS. 1A to 1D are cross-section views schematically illustrating an example of an embodiment of a method for treating a gallium nitride substrate for the forming of electronic components inside and on top of this substrate.

FIG. 1A schematically shows an N-type doped single-crystal gallium nitride substrate 101 (GaN). In this example, substrate 101 is formed on a silicon support 103. The described embodiments are however compatible with solid gallium nitride substrates (freestanding).

As appears in FIG. 1A, substrate 101 comprises dislocations. Some of these dislocations, referred to as 105 in the drawing, emerge on the side of the surface of substrate 101 opposite to silicon support 103, which will be called hereafter, by convention, the upper surface of substrate 101.

Emerging dislocations 105 are capable of causing malfunctions in electronic components where one or several conductive, semiconductor, or insulating layers (not shown) coat the upper surface of substrate 101. They are particularly problematic when a Schottky diode comprising a Schottky contact between substrate 101 and a conductive layer (not shown), for example, made of metal, coating the upper surface of substrate 101, is desired to be formed. Indeed, the contact areas between dislocations 105 and the conductive layer form areas of lower potential barrier in the Schottky junction, which locally decreases the reverse withstand voltage of the diode and increases reverse leakage currents with respect to a diode comprising no dislocation emerging on the Schottky contact.

It is here provided to treat substrate 101 to overcome all or part of the disadvantages linked to the presence of dislocations 105 emerging on its upper surface side.

To achieve this, it is provided to open an upper portion of dislocations 105 emerging on the upper surface side of substrate 101, that is, to form in substrate 101, on its upper surface side, recesses in front of dislocations 105, and then to fill the openings with gallium nitride of a conductivity type opposite to that of the substrate.

Figure 1B:
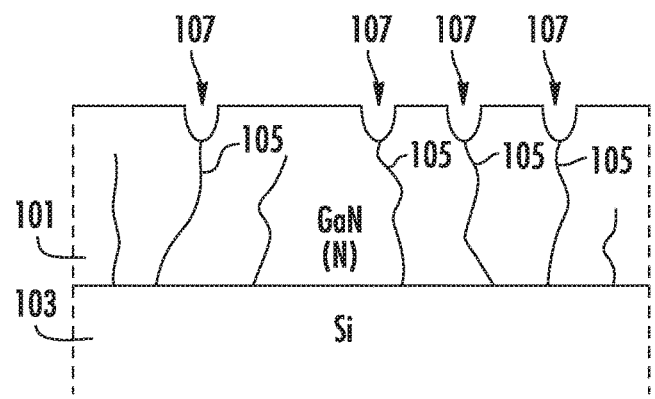

FIG. 1B illustrates a step of forming recesses 107 in substrate 101, on the upper surface side thereof, opposite to dislocations 105 emerging on the upper surface side of the substrate.

In a preferred embodiment, to form recesses 107, the upper surface of substrate 101 is placed in contact with a chemical etching solution capable of preferentially etching the areas of substrate 101 surrounding dislocations 105 over the areas of substrate 101 comprising no dislocations emerging on the upper surface of the substrate. A solution based on potassium hydroxide (KOH) may for example be used. As a variation, a solution based on orthophosphoric acid ($H_3PO_4$) may be used. To obtain a marked etching of the substrate areas surrounding dislocations 105, the concentration of the etching agent in the solution is preferably relatively high, for example, in the range 10% to 90% in the case of potassium hydroxide or of orthophosphoric acid.

As a variation, to form recesses 107, the upper surface of substrate 101 may be submitted to an etching plasma, for example, a chlorinated or argon plasma or any other appropriate etching gas.

As a variation, to form recesses 107, substrate 101 may be annealed at a relatively high temperature, preferably higher than 830° C., which causes an opening of the upper portion of dislocations 105 emerging on the upper surface of the substrate.

More generally, any method capable of forming recesses 107 extending in substrate 101 from its upper surface, opposite to dislocations 105, may be used.

As an example, recesses 107 extend in substrate 101 from its upper surface down to a depth approximately in the range from 0.2 to 10 µm, and have a diameter or a width approximately in the range from 0.001 to 0.5 µm.

In the shown example (FIGS. 1C and 1D), to fill recesses 107, it is provided to form, by epitaxy, a doped gallium nitride layer of a conductivity type opposite to that of the substrate (that is, a P-type layer in this example) coating the upper surface of substrate 101, and then to planarize this layer to remove it everywhere except inside of recesses 107.

Figure 1C:
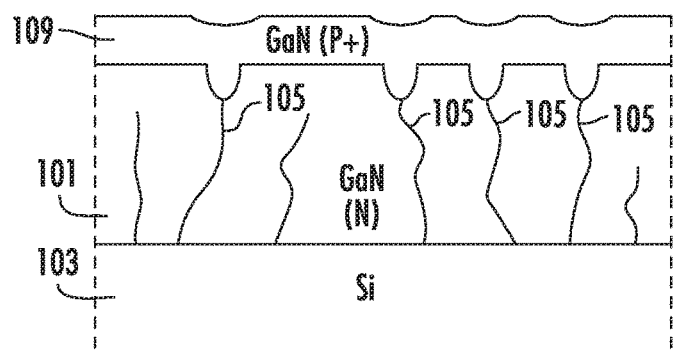

FIG. 1C illustrates a step, subsequent to the step of forming of recesses 107, of epitaxial deposition of a P-type doped single-crystal gallium nitride layer 109 over the entire surface of substrate 101. Layer 109 is for example formed by chemical vapor deposition, according to a method currently called metal organic chemical vapor deposition, MOCVD, in the art. As a variation, layer 109 is formed according to a method currently called MBE ("Molecular Beam Epitaxy") in the art or by a method currently called RPCVD ("Remote Plasma Chemical Vapor Deposition") in the art. Any other method capable of depositing a doped gallium nitride layer of a conductivity type opposite to that of substrate 101 may be used. To obtain a P-type doping, magnesium may for example be provided in the deposition source. The doping level of layer 109 is preferably greater than that of substrate 101. As an example, substrate 101 has a doping level in the range $10^{15}$ to $2*10^{16}$ atoms/cm$^3$, and layer 109 has a doping level greater than $10^{17}$ atoms/cm$^3$.

The thickness of layer 109 is preferably selected to totally fill recesses 107, for example all the way to the upper surface level of substrate 101. As an example, layer 109 has a thickness in the range 0.2 to 15 µm.

Figure 1D:
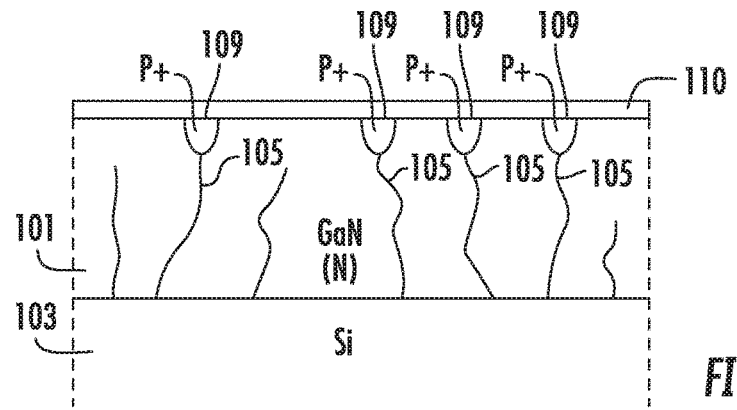

FIG. 1D illustrates a planarization step, following the deposition of layer 109, during which layer 109 is thinned from its upper surface, until it is totally removed opposite to the regions substrate 101 which have not been recessed at the step described in relation with FIG. 18, to clear the access to the upper surface of substrate 101 in these regions. During the planarization step, the P-type doped gallium nitride of layer 109 is removed everywhere except from recesses 107. A small thickness of substrate 101 may possibly be removed during the planarization, to guarantee the removal of any P-type doped gallium nitride residue from the upper surface of the regions of substrate 101 which have not been recessed at the step described in relation with FIG. 1B. The planarization is unterrupted before reaching the bottom of recesses 107, to keep P-type doped gallium nitride areas forming an interface between dislocations 105 and the upper surface of the semiconductor structure. In a preferred embodiment, the planarization step of FIG. 1D is performed at least partly and preferably totally by chem.-mech. polishing (CMP).

An advantage of the embodiment described in relation with FIGS. 1A to 1D is that it enables to avoid for dislocations of the substrate to directly emerge on a surface of the substrate intended to receive conductive, semiconductor, or insulating layers of a semiconductor gallium nitride component.

This embodiment is particularly advantageous for the forming of a Schottky diode comprising a Schottky contact between substrate 101 and a conductive layer 110, for example, made of metal, coating the upper surface of substrate 101. Indeed, the presence of the P-type doped local interface regions enables to avoid a drop of the potential barrier at dislocations 105 when the diode is reverse-biased. This enables to improve the reverse withstand voltage of the diode. This further enables to decrease reverse current leakages in the diode via dislocations 105. It should be noted that in the case of a Schottky diode, the doping level of the P-type regions should be sufficiently high for the reverse withstand voltage of the diode to take place at the level of the Schottky interface, and not at the level of the PN diodes formed between the P-type gallium nitride filling recesses 107 and substrate 101.

Specific embodiments have been described. Various alterations, modifications, and improvements will readily occur to those skilled in the art.

In particular, the above-described embodiments are not limited to the forming of a diode comprising a Schottky contact between substrate 101 and a conductive layer 110 coating the upper surface of the substrate. The method for treating substrate 101 described in relation with FIGS. 1A to 1D may be used for the forming of other gallium nitride semiconductor components, for example, PN power diodes, bipolar power transistors, light-emitting diodes, heterojunction transistors, heterojunction diodes, or any other gallium nitride component capable of taking advantage of the provided treatment of the dislocations emerging on the upper surface side of the substrate.

Further, the described embodiments are not limited to the treatment of only the dislocations emerging on the upper surface side of the substrate. Thus, in the case of a solid (freestanding) substrate, it will be within the abilities of those skilled in the art to adapt the method described in relation with FIGS. 1A and 1B to treat not only dislocations emerging on the upper surface side of the substrate, but also dislocations emerging on the lower surface side of the substrate if this is advantageous for the envisaged use of the substrate.

Further, the described embodiments are not limited to the treating of an N-type doped gallium nitride substrate, but may be applied to the treating of a P-type doped substrate.

In this case, it will be provided to fill with N-type doped gallium nitride recesses 107 formed at the step of FIG. 1B.

alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

That which is claimed is:

1. A method of treating a doped gallium nitride substrate of a first conductivity type, having a plurality of dislocations emerging on an upper surface thereof, the method comprising:
    forming, where each dislocation emerges, a recess extending into the upper surface;
    forming a doped single-crystal gallium nitride layer of a second conductivity type on the upper surface; and
    removing the doped single-crystal gallium nitride layer of the second conductivity type from the upper surface except from the recess to form an interface of the doped single-crystal gallium nitride layer of the second conductivity type separating the dislocation from the upper surface of the doped gallium nitride substrate of a first conductivity type and the dislocation stopping at the interface.

2. The method of claim 1, wherein removing the doped single-crystal gallium nitride layer of the second conductivity type comprises planarization of the doped single-crystal gallium nitride layer of the second conductivity type.

3. The method of claim 2, wherein planarization comprises chemo-mechanical polishing.

4. The method of claim 1, wherein forming the recesses comprises applying a wet etching solution to the upper surface.

5. The method of claim 4, wherein the wet etching solution comprises potassium hydroxide at a concentration in a range of 10 to 90%.

6. The method of claim 4, wherein the wet etching solution comprises phosphoric acid at a concentration in a range of 10 to 90%.

7. The method of claim 1, wherein forming the recesses comprises applying a chlorine plasma to the upper surface.

8. The method of claim 1, further comprising annealing the upper surface at a temperature greater than or equal to 830° C.

9. The method of claim 1, wherein the first and second conductivity types respectively are N and P conductivity types.

10. A method of semiconductor processing comprising:
    treating a doped gallium nitride layer of a first conductivity type, having a plurality of dislocations emerging on an upper surface thereof by at least
        forming, where each dislocation emerges, a recess extending into the doped gallium nitride layer of the first conductivity type from the upper surface,
        forming a doped single-crystal gallium nitride layer of a second conductivity type on the upper surface, and
        removing the doped single-crystal gallium nitride layer of the second conductivity type from the upper surface except from the recess to form an interface of the doped single-crystal gallium nitride layer of the second conductivity type separating the dislocation from the upper surface of the doped gallium nitride substrate of a first conductivity type and the dislocation stopping at the interface.

11. The method of claim 10, wherein removing the doped single-crystal gallium nitride layer of the second conductivity type comprises planarization of the doped single-crystal gallium nitride layer of the second conductivity type.

12. The method of claim 11, wherein planarization comprises chemo-mechanical polishing.

13. The method of claim 10, wherein forming the recesses comprises applying a wet etching solution to the upper surface.

14. The method of claim 10, wherein forming the recesses comprises applying a plasma to the upper surface.

15. The method of claim 10, further comprising annealing the upper surface at a temperature greater than or equal to 830° C.

16. The method of claim 10, further comprising forming at least one of a conductive layer, a semiconductor layer, and an insulating layer on the upper surface.

17. The method of claim 10, further comprising forming a conductive layer on the upper surface to form a Schottky diode.

18. A method of semiconductor processing comprising:
    treating a doped gallium nitride layer of a first conductivity type, having a plurality of dislocations emerging on an upper surface thereof by at least
        forming, where each dislocation emerges, a recess extending into the upper surface,
        forming a doped single-crystal gallium nitride layer of a second conductivity type on the upper surface, and
        removing the doped single-crystal gallium nitride layer of the second conductivity type from the upper surface except from the recess to form an interface of the doped single-crystal gallium nitride layer of the second conductivity type separating the dislocation from the upper surface of the doped gallium nitride substrate of a first conductivity type and the dislocation stopping at the interface; and
    forming a conductive layer on the upper surface to form a Schottky diode.

19. The method of claim 18, wherein removing the doped single-crystal gallium nitride layer of the second conductivity type comprises planarization of the doped single-crystal gallium nitride layer of the second conductivity type.

* * * * *